(12) United States Patent
Takawa et al.

(10) Patent No.: US 7,746,638 B2
(45) Date of Patent: Jun. 29, 2010

(54) ELECTRONIC DEVICE

(75) Inventors: Hiroshi Takawa, Kawasaki (JP);
Noboru Izuhara, Kawasaki (JP);
Mitsuru Yumoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 20 days.

(21) Appl. No.: 12/318,155

(22) Filed: Dec. 22, 2008

(65) Prior Publication Data
US 2009/0244840 A1  Oct. 1, 2009

(30) Foreign Application Priority Data
Mar. 26, 2008  (JP) .............................. 2008-080735

(51) Int. Cl.
*H05K 7/20* (2006.01)
(52) U.S. Cl. .................. 361/690; 361/689; 361/700; 361/704; 361/719; 361/721; 257/706; 257/712; 257/715; 165/80.3; 165/104.26; 174/16.1; 174/15.2
(58) Field of Classification Search .................. None
See application file for complete search history.

(56) References Cited
U.S. PATENT DOCUMENTS

| | | | |
|---|---|---|---|
| 5,994,679 A * | 11/1999 | DeVeau et al. .............. | 219/530 |
| 6,018,602 A | 1/2000 | Mayor et al. | |
| 6,132,104 A * | 10/2000 | Bliss et al. ..................... | 385/53 |
| 6,517,221 B1 * | 2/2003 | Xie ............................. | 362/373 |
| 6,868,217 B1 * | 3/2005 | Moulton et al. ............. | 385/135 |
| 6,917,638 B2 * | 7/2005 | Suzuki et al. ................. | 372/36 |
| 7,073,960 B2 * | 7/2006 | Anderl et al. ................. | 385/92 |
| 7,191,823 B2 * | 3/2007 | Harker et al. ................. | 165/96 |
| 7,299,859 B2 * | 11/2007 | Bolle et al. ............ | 165/104.21 |

FOREIGN PATENT DOCUMENTS

| | | |
|---|---|---|
| JP | 11-26852 | 1/1999 |
| JP | 2002-162166 | 6/2002 |
| JP | 2005-159560 | 6/2005 |

OTHER PUBLICATIONS

JP 2005-159560 and JP 11-26852 are discussed on p. 1 of the application specification.
JP 11-26852 corresponds to US 6,018,602.

* cited by examiner

*Primary Examiner*—Boris L Chervinsky
(74) *Attorney, Agent, or Firm*—Staas & Halsey LLP

(57) ABSTRACT

An electronic device is provided that includes a first component generating heat, a second component to be heated, a heating part configured to heat the second component, and a case containing the first component, the second component, and the heating part. The second component is heated with the heating part and the heat generated by the first component.

15 Claims, 16 Drawing Sheets

HEAT

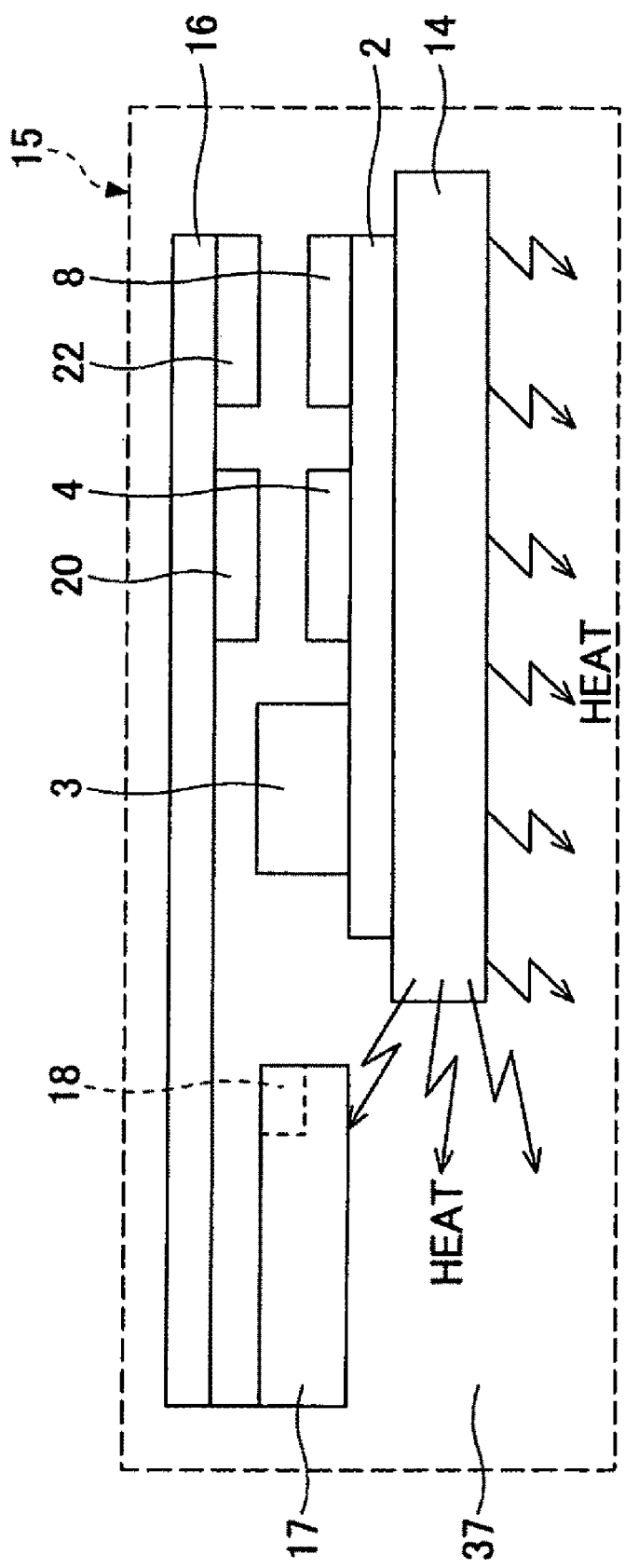

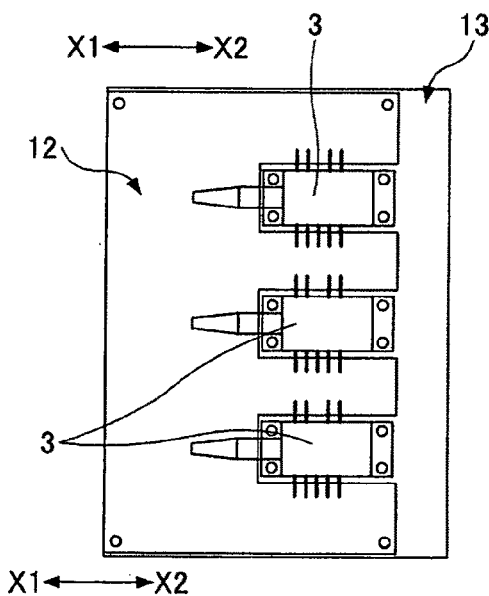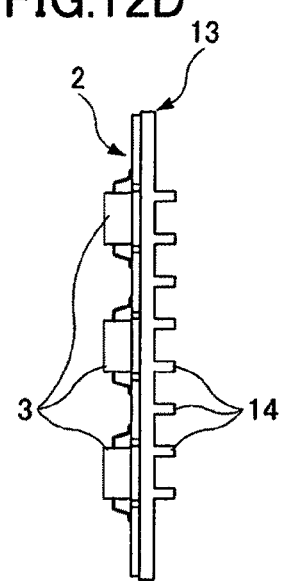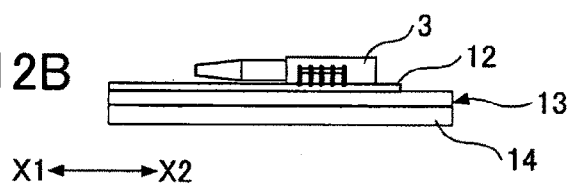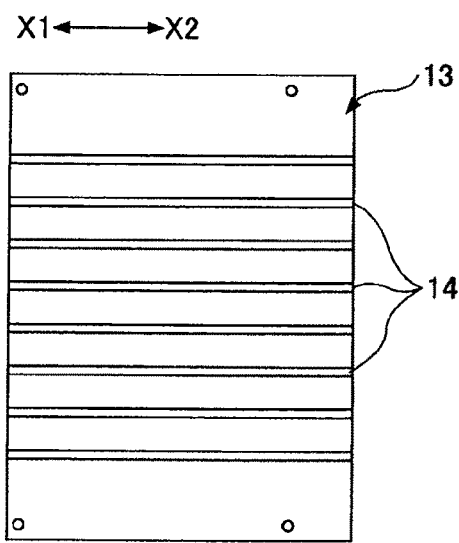

ELECTRONIC DEVICE

BACKGROUND OF THE INVENTION

1. Field of the Invention

The present invention relates generally to electronic devices, and more particularly to an electronic device having a heating component that generates heat and a heated component that needs to be heated provided together in the same case.

2. Description of the Related Art

In general, electronic devices have various heating components as represented by semiconductor devices on a board provided inside a case. If the temperature of a heating component is not maintained at a predetermined operating environment temperature, other electronic components mounted on the board may be damaged or the heating component (such as a semiconductor device) itself may be prevented from operating properly by heat.

Therefore, in an electronic device having a heating component, a heat dissipation part that dissipates heat generated in the heating component is provided as described in Japanese Laid-Open Patent Application No. 2005-159560 or the heating component is cooled with a Peltier element as described in Japanese Laid-Open Patent Application No. 11-026852. Further, the electronic device is configured to discharge the heat radiated from the heating component outside the case with efficiency.

Optical fiber amplifiers (hereinafter referred to as "optical amplifiers") are known as electronic devices. Some optical amplifiers employ an optical fiber doped with a rare-earth element for long-range light signal communications. Of these, erbium-doped fiber amplifiers (EDFAs) are well known.

The erbium-doped optical fiber (EDF) has a disposition to amplify a light signal having a wavelength in the 1.5 µm wavelength range with light having a wavelength in the 0.98 µm or 1.48 µm range (referred to as "pump light"). By inputting the light signal and the pump light to the erbium-doped optical fiber, the signal light is amplified and output. The characteristics of the erbium-doped optical fiber depend on the length, the dopant and doping density, the pump light wavelength, the pump light power, the temperature, etc., of the erbium-doped optical fiber.

In practical use, an erbium-doped optical fiber having a length corresponding to a dopant and doping density is provided in an optical amplifier so as to achieve desired amplification characteristics, and a laser used for pump light also is controlled to be constant in wavelength and output. However, with respect to temperature, the dependence on use environment temperature causes amplification characteristics to vary depending on the use environment temperature. Therefore, it is necessary to keep amplification characteristics constant by keeping constant the temperature of the erbium-doped optical fiber.

It is known to keep constant the temperature of the erbium-doped optical fiber by keeping it constant at the upper limit of the use environment temperature with a heater. In order to keep the erbium-doped optical fiber at a constant temperature, the erbium-doped optical fiber is wound around inside a metal having good heat transfer characteristics, and a heater is attached to the metal to increase the temperature. Further, it is necessary to cover the metal with a heat insulator or provide the metal in a closed space where a sufficient heat insulation distance is ensured in order to prevent heat from escaping around or prevent the temperature from varying.

FIG. 1 is a schematic diagram showing a conventional optical amplifier 1 to which an erbium-doped optical fiber is applied. The optical amplifier 1 includes a first board 2 and a second board 16 in a case 15. A laser diode (LD) 3, an LD drive unit 4, and an LD temperature controller 8 are provided on the first board 2. Further, an optical amplification element 17, a heater drive unit 20, and a heater temperature controller 22 are provided on the second board 16.

The LD 3 generates pump light for an amplifying operation. Normally, the required output power of the LD 3 is several tens to several hundreds of mW. It is desirable to dissipate heat generated in the LD 3 with efficiency in order to obtain this output stably. Therefore, radiating (heat dissipating) fins 14 are thermally coupled to the LD 3, so that the heat is directly dissipated through these radiating fins 14.

Further, the optical amplifier 1 shown in FIG. 1 has a Peltier element 9 provided on the LD 3 so as to forcibly cool the LD 3 with the Peltier element 9 in order to further improve its heat dissipation characteristics. The heat generated in the Peltier element 9 by the cooling of the LD 3 is dissipated outside using the radiating fins 14.

On the other hand, the optical amplification element 17 provided on the second board 16 has an erbium-doped optical fiber wound around an EDF reel 19. In this case, it is desirable to wind the erbium-doped optical fiber with a radius of, for example, 20 mm or more in view of its bending loss characteristics, and it is desirable to contain the optical fiber for a length of, for example, several tens of meters or more because of gain. Therefore, the range that requires increases in temperature widens. Further, in the case of a use environment temperature range of 0° C. to 65° C., it is necessary to increase temperature from 0° C. to 65° C. if the environmental temperature is 0° C.

Therefore, a heater 18 is provided in the optical amplification element 17, so that the optical amplification element 17 is heated to the use environment temperature with this heater 18. Further, the optical amplification element 17 is housed inside a heat insulator 24 so as to prevent the applied heat from escaping outside.

FIG. 2A is a block diagram showing a system for controlling the temperature of the LD 3. FIG. 2B is a block diagram showing a system for controlling the temperature of the heater 18. As shown in FIG. 2A, the LD 3 is driven by an LD oscillation control circuit 5 and an LD driver circuit 6 forming the LD drive unit 4 (FIG. 1). Further, the driving increases the temperature of the LD 3, which is detected by an LD temperature sensor 11 provided near the LD 3 as shown in FIG. 1.

The temperature detected by the LD temperature sensor 11 is fed to an LD temperature monitoring circuit 12 forming the LD temperature controller 8 (FIG. 1), and the LD temperature controller 8 determines based on this fed temperature whether it is necessary to drive the Peltier element 9. If the LD temperature controller 8 determines that the radiating fins 14 alone do not dissipate heat sufficiently, the LD temperature controller 8 drives the Peltier element 9 through a device driver circuit 10 to forcibly cool the LD 3. The starting and stopping of this driving of the Peltier element 9 is suitably performed in accordance with the temperature of the LD 3 fed from the LD temperature sensor 11.

Further, as shown in FIG. 2B, the temperature of the heater 18 is controlled based on a signal fed from a heater temperature sensor 21 (also shown in FIG. 1) that measures the temperature of the EDF reel 19 (around which the erbium-doped optical fiber is wound) provided inside the optical amplification element 17. A heater temperature monitoring circuit 23 forming the heater temperature controller 22 controls the heater drive unit 20 based on the temperature of the EDF reel 19 transmitted from the heater temperature sensor 21, so that the temperature of the EDF reel 19 is controlled to the above-described predetermined environmental temperature.

As shown in FIG. 1, the optical amplification element 17 having the erbium-doped optical fiber serving as an amplification medium provided therein and the LD 3 serving as a pump light source are often housed inside the single (same) case 15 as the optical amplifier 1. Therefore, the optical amplification element 17 (erbium-doped optical fiber) desired to be kept at high temperature and the LD 3 desired to be cooled or have its heat dissipated are provided close to each other.

Conventionally, the heat transfer channel for the heat generated from the LD 3 and the heat transfer channel for the heat fed to the optical amplification element 17 are separated and cut off from each other. That is, in the LD 3, the heat generated therein and the heat discharged from the Peltier element 9 are guided to the radiating fins 14 so as to be discharged outside the case 15 from the radiating fins 14. Therefore, the radiating fins 14 are often provided external to the case 15.

On the other hand, the optical amplification element 17 is housed inside the heat insulator 24 to thermally separate the inside of the LD drive unit 4 and the optical amplifier 17 so that the heat generated by the heater 18 is prevented from being dissipated outside the case 15.

Thus, according to the conventional optical amplifier 1, since it is necessary to mount components having conflicting thermal channels of heat dissipation and heat application, electric power is consumed to control their respective temperatures. Therefore, there is a problem in that the difference between the temperature of the optical amplification element 17 and the ambient temperature grows to increase the electric power for heating particularly at a low-temperature time.

SUMMARY OF THE INVENTION

According to one embodiment of the present invention, an electronic device is provided that may solve or reduce the above-described problem.

According to one embodiment of the present invention, an electronic device is provided that makes it possible to reduce electric power for temperature control.

According to one embodiment of the present invention, an electronic device is provided that includes a first component generating heat, a second component to be heated, a heating part configured to heat the second component, and a case containing the first component, the second component, and the heating part, wherein the second component is heated with the heating part and the heat generated by the first component.

According to one embodiment of the present invention, an electronic device is provided that includes a first component generating heat, a second component to be heated, a heating part configured to heat the second component, and a case containing the first component, the second component, and the heating part, wherein the second component is placed in a channel through which the heat generated by the first component is dissipated.

According to one embodiment of the present invention, an electronic device is provided that includes a first component generating heat, a second component to be heated, a heating part configured to heat the second component, a heat pipe having a cooling side thereof thermally coupled to the first component and having a heat dissipating side thereof thermally coupled to the second component, and a case containing the first component, the second component, the heating part, and the heat pipe.

According to one aspect of the present invention, since a component to be heated or required to be heated is heated with the heat generated by a heating (heat-generating) component, it is possible to reduce the amount of heat that a heating part needs to heat the component to be heated to a predetermined environmental temperature.

BRIEF DESCRIPTION OF THE DRAWINGS

Other objects, features and advantages of the present invention will become more apparent from the following detailed description when read in conjunction with the accompanying drawings, in which:

FIG. 3 is a schematic diagram for illustrating the principle of an optical amplifier according to an embodiment of the present invention;

FIG. 5A is a perspective view of the optical amplifier from its air-outlet side and FIG. 5B is a perspective view of the optical amplifier from its air-intake side;

FIG. 7A is a top-side perspective view of the optical amplifier without the lower case and FIG. 7B is a perspective view of the optical amplifier of FIG. 7A turned upside down;

FIGS. 8A through 8D are a top plan view, a bottom plan view, a view taken in the direction of arrows A of FIG. 8B, and a view taken in the direction of arrows B of FIG. 8B, respectively, of the optical amplifier without the lower case;

FIGS. 10A and 10B are a top plan view and a bottom plan view, respectively, of the upper case and FIG. 10C is a cross-sectional view of the upper case taken along the line C-C of FIG. 10B;

FIG. 11A is a top-side perspective view of the first board and the radiator plate and FIG. 11B is a perspective view of the first board and the radiator plate of FIG. 11A turned upside down;

FIGS. 12A, 12B, 12C, and 12D are diagrams showing the first board and the radiator plate of the optical amplifier according to the embodiment of the present invention, where FIGS. 12A through 12D are a top plan view, a side view, a bottom plan view, and a rear view, respectively, of the first board and the radiator plate;

FIGS. 15A through 15C are a side view, a top plan view, and a rear view, respectively, of the second variation of the optical amplifier.

DETAILED DESCRIPTION OF THE PREFERRED EMBODIMENTS

A description is given below, with reference to the accompanying drawings, of embodiments of the present invention.

First, a description is given, with reference to FIG. 3, of the principle of an electronic device according to an embodiment of the present invention. The electronic device according to this embodiment has a heating component that generates heat and a heated component to be heated or required to be heated with a heating part provided together in a case.

Figure 1:
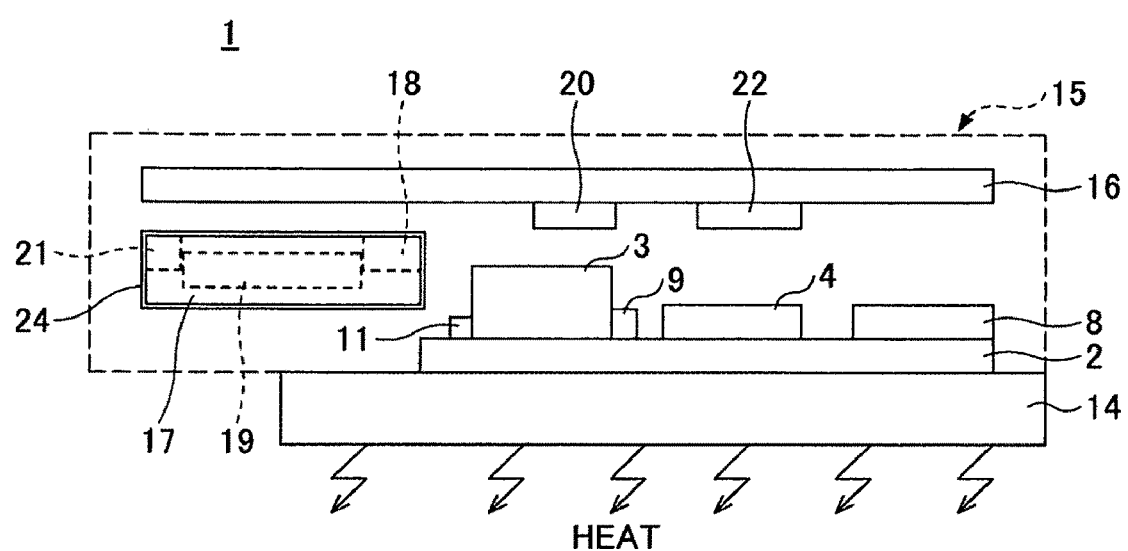
FIG. 1 is a schematic diagram showing a conventional optical amplifier.
Figure 2A:
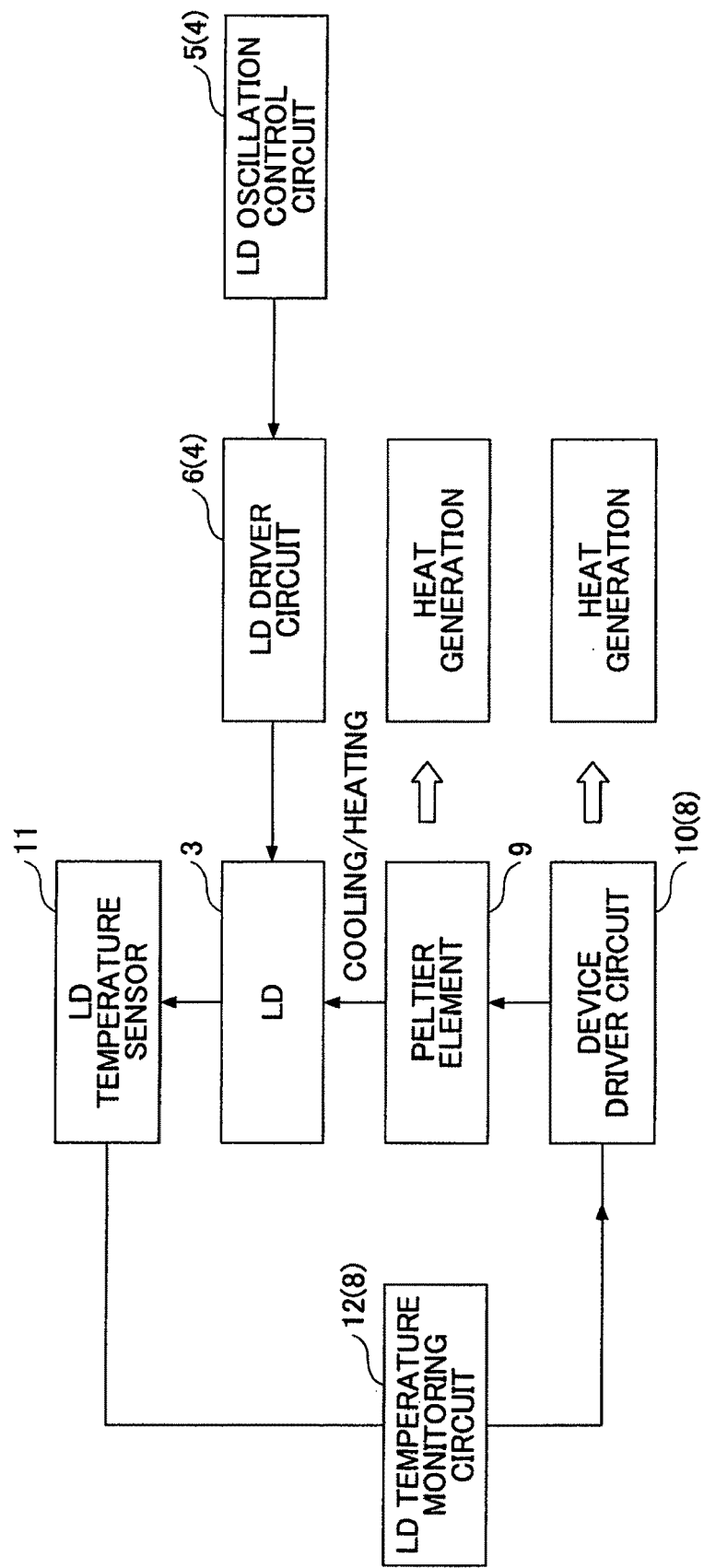
FIG. 2A is a block diagram showing a system for controlling the temperature of an LD.
Figure 2B:
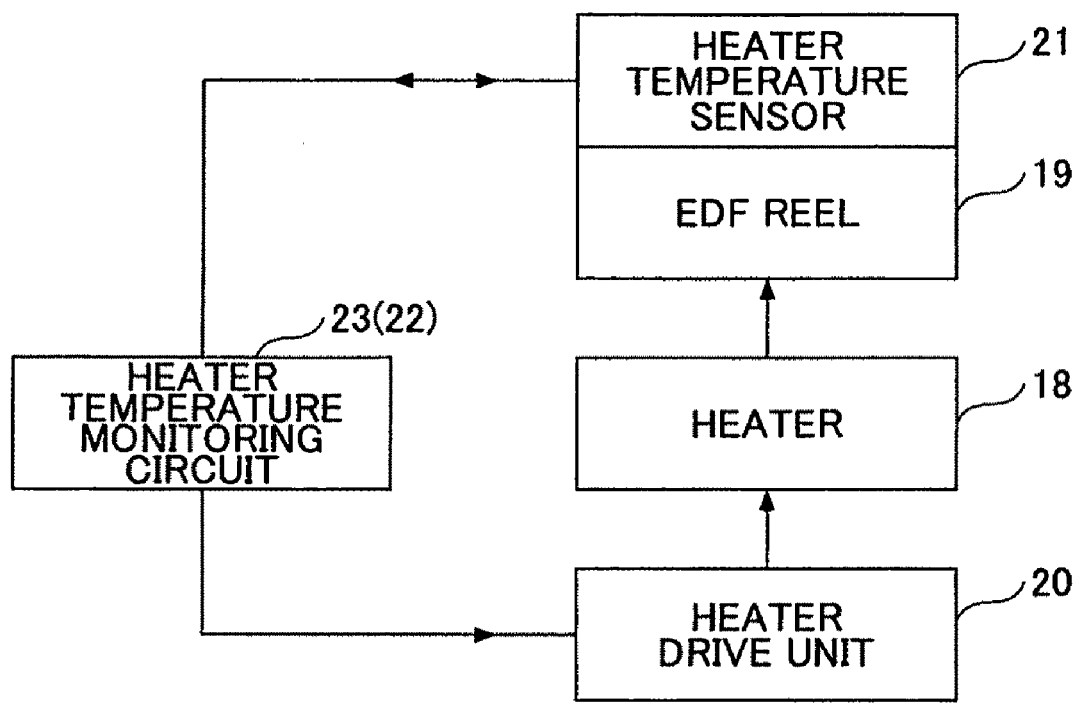
FIG. 2B is a block diagram showing a system for controlling the temperature of a heater.

In the following description, an optical amplifier using an erbium-doped optical fiber is taken as an example of this type of electronic device. However, the present invention is also applicable to other electronic devices as long as they have a heating component that generates heat and a heated component to be heated with a heating part provided together in a case. In the drawings used for the following description of this embodiment, elements or configurations corresponding to those shown in FIG. 1 and FIGS. 2A and 2B are referred to by the same reference numerals, and a description thereof is suitably omitted.

The optical amplifier 30 includes the first board 2 and the second board 16 in the case (module case) 15. The LD 3, the LD drive unit 4, and the LD temperature controller 8 are provided on the first board 2. Further, the optical amplification element 17, the heater drive unit 20, and the heater temperature controller 22 are provided on the second board 16.

The LD 3 generates pump light for an amplifying operation. The LD 3 is a heating component, and it is desirable to dissipate heat generated in the LD 3 with efficiency in order to obtain a stable output. Therefore, the radiating (heat dissipating) fins 14 are thermally coupled to the LD 3, so that the heat is directly dissipated through these radiating fins 14. In this embodiment, the radiating fins 14 are provided not external to but inside the case 15.

A Peltier element may be provided on the LD 3 in order to improve the heat dissipation characteristics of the LD 3. In this embodiment, however, a description is given of the case without a Peltier element for convenience of graphical representation and description.

Figure 4:
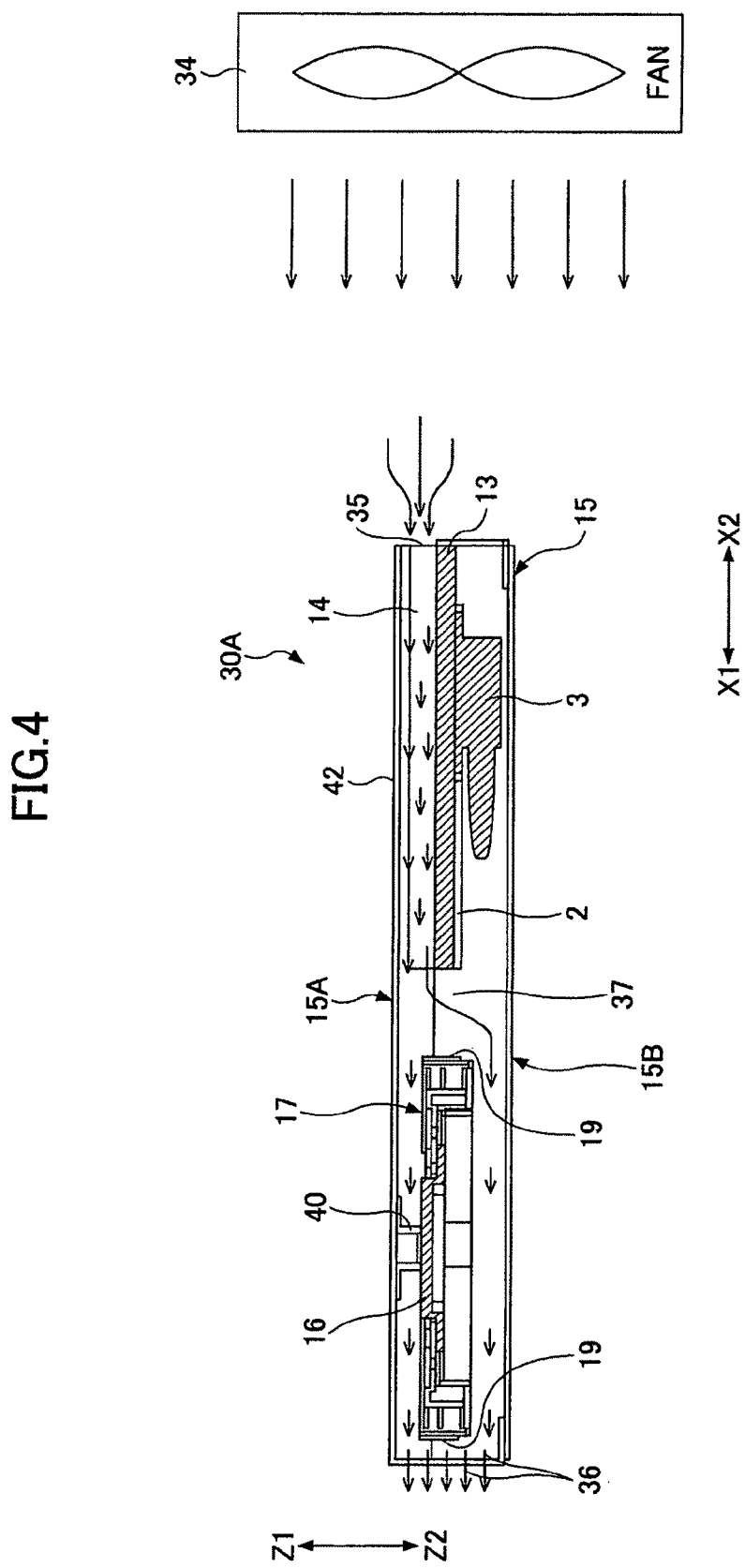
FIG. 4 is a cross-sectional view of an optical amplifier according to an embodiment of the present invention.

The optical amplification element 17 is provided on the second board 16. The optical amplification element 17 has an erbium-doped optical fiber wound around the EDF reel 19 (FIG. 4). In this case, it is desirable to wind the erbium-doped optical fiber with a radius of, for example, 20 mm or more in view of its bending loss characteristics, and it is desirable to contain the optical fiber for a length of, for example, several tens of meters or more because of gain, so that the range that requires increases in temperature widens as described above.

Therefore, the heater 18 serving as a heating part is provided in the optical amplification element 17, so that the optical amplification element 17 can be heated with this heater 18. Further, the heat insulator 24 (FIG. 1), which is conventionally provided for thermally insulating the optical amplification element from outside, is not provided in this embodiment. That is, heat can be transferred between the optical amplification element 17 and the air (temperature environment) of the case 15.

Next, a description is given of a heat dissipation channel through which heat generated in the LD 3 is dissipated. The heat generated in the LD 3 is thermally conducted to the radiating fins 14 to be discharged from the radiating fins 14. According to this embodiment, since the radiating fins 14 are positioned inside the case 15, the heat discharged from the radiating fins 14 is thermally conducted to the air inside the case 15. The inside of the case 15 serves as a heat dissipation channel 37 and the air inside the case 15 serves as a heat conduction medium, so that the heat discharged from the radiating fins 14 is thermally conducted to the optical amplification element 17.

As described above, according to this embodiment, the heat insulator 24 is not provided for the optical amplification element 17, so that the air inside the case 15 serves as a heat conduction medium to feed the heat conducted from the radiating fins 14 to the optical amplification element 17. As a result, the temperature of the optical amplification element 17 increases. Thus, according to this embodiment, the optical amplification element 17 is heated with the heat generated by the LD 3, so that the temperature of the optical amplification element 17 rises. Therefore, it is possible to reduce the amount of heat applied by the heater 18, so that it is possible to reduce electric power for driving the heater 18.

Next, a description is given of an embodiment based on the above-described principle.

Figure 5A:
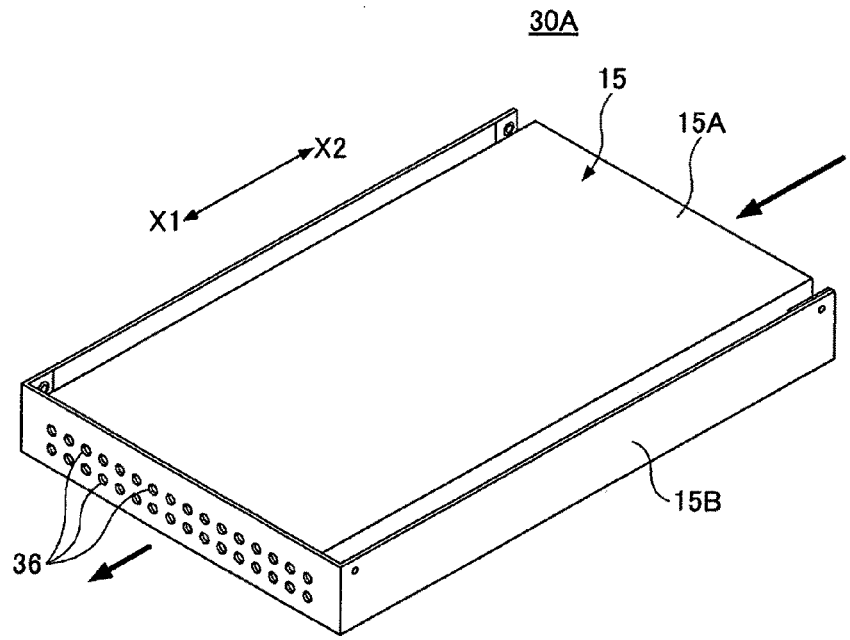
FIGS. 5A and 5B are diagrams showing the exterior of the optical amplifier according to the embodiment of the present invention, where
Figure 5B:
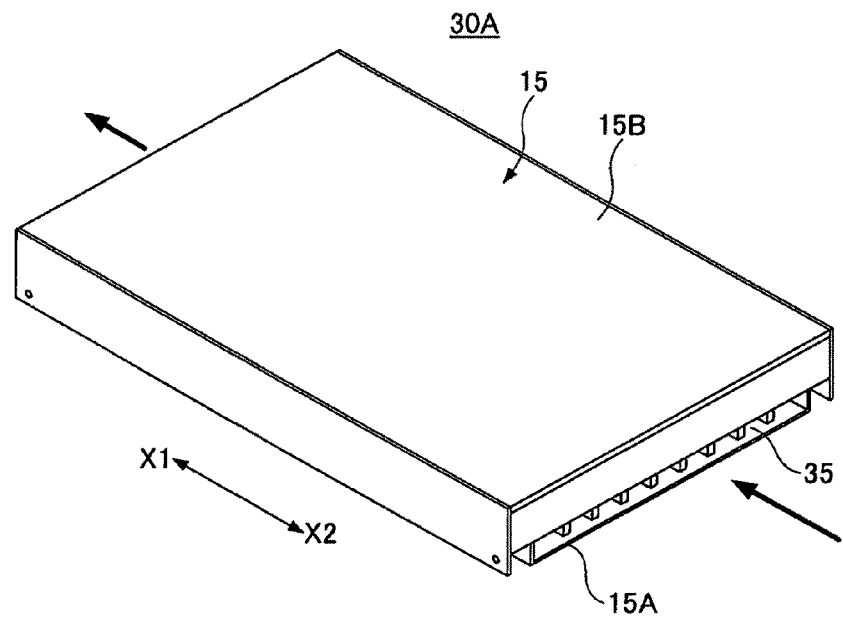

FIG. 4 and FIGS. 5A and 5B are diagrams showing an optical amplifier 30A according to an embodiment of the present invention. FIG. 4 shows a cross section of the optical amplifier 30A. FIGS. 5A and 5B show the exterior of the optical amplifier 30A. For example, the optical amplifier 30A according to this embodiment may be provided on a plug-in unit 31 as shown in FIG. 6.

Figure 6:
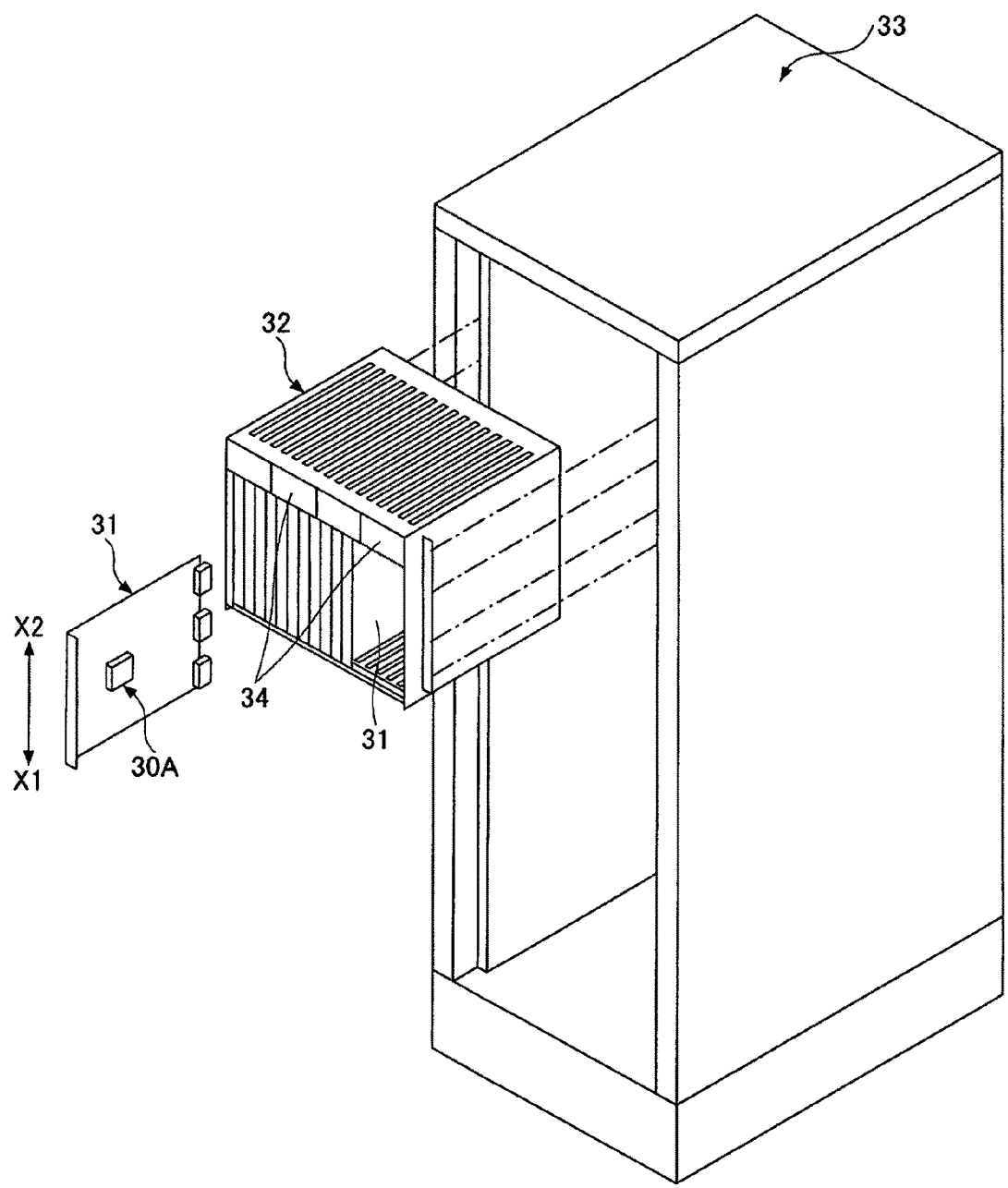
FIG. 6 is a diagram for illustrating an application of the optical amplifier according to the embodiment of the present invention.

FIG. 6 is a diagram for illustrating an application of the optical amplifier 30A according to this embodiment. Referring to FIG. 6, the plug-in unit 31 is housed in a sub-rack 32 to be placed in a sub-rack placement rack 33. Air blowers (fans) 34 are provided in the upper part of the sub-rack 32, so that cooling air is sent toward the optical amplifier 30A from the corresponding air blower 34.

The optical amplifier 30A has the case 15, which is formed by combining an upper case 15A and a lower case 15B. As illustrated in FIG. 5B, an air intake 35 is provided at the X2 end of the case 15. As illustrated in FIG. 5A, an air outlet 36, which may have multiple openings, is provided at the X1 end of the case 15. Accordingly, the cooling air fed from the air blower 34 flows into the case 15 through the air intake 35 to be discharged outside the case 15 through the air outlet 36. In FIGS. 5A and 5B, the flow of the cooling air is indicated by bold arrows.

Figure 7A:
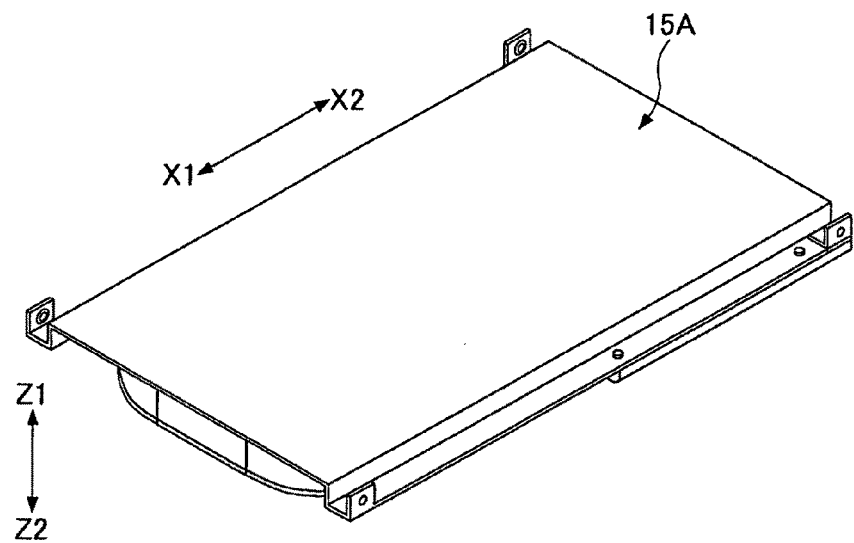
FIGS. 7A and 7B are diagrams showing the optical amplifier without a lower case according to the embodiment of the present invention, where
Figure 7B:
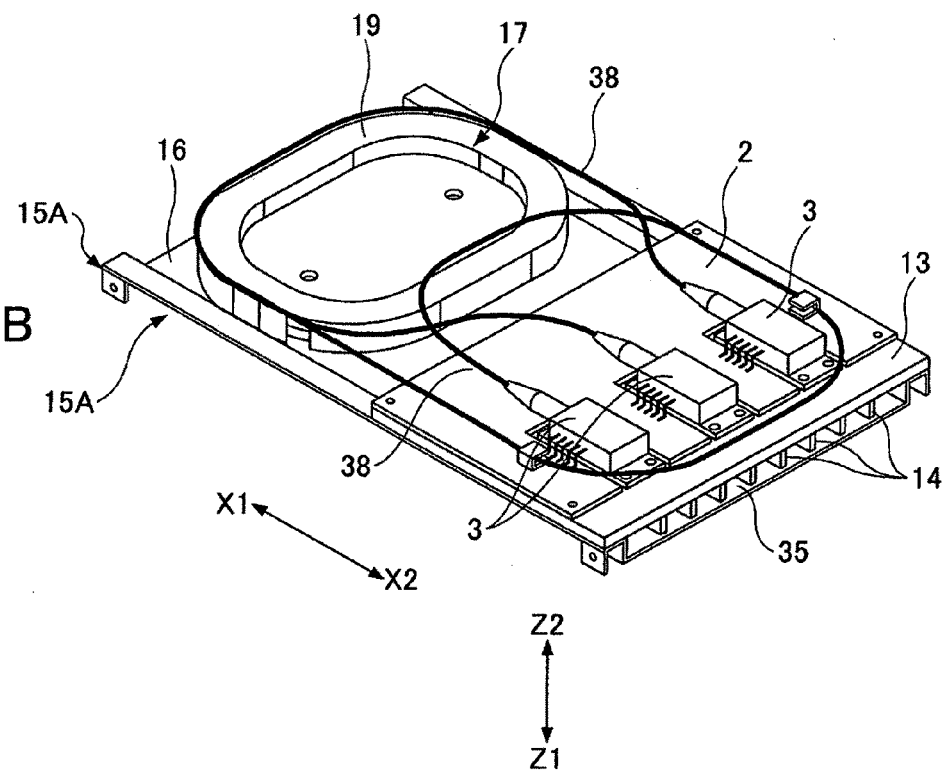
Figure 8A:
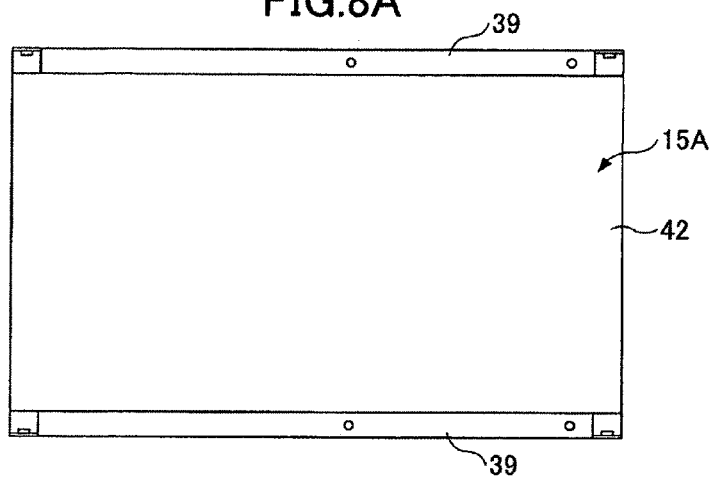
FIGS. 8A, 8B, 8C, and 8D are diagrams showing the optical amplifier without the lower case according to the embodiment of the present invention, where
Figure 8B:
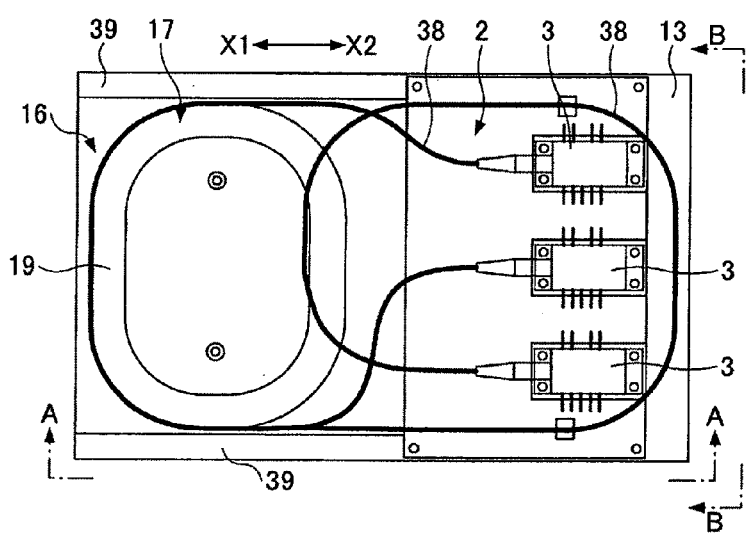
Figure 8D:
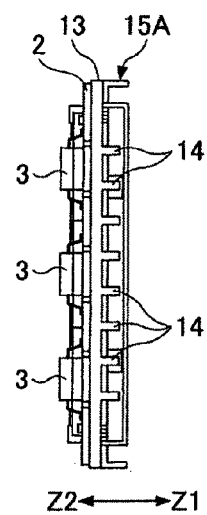
Figure 8C:
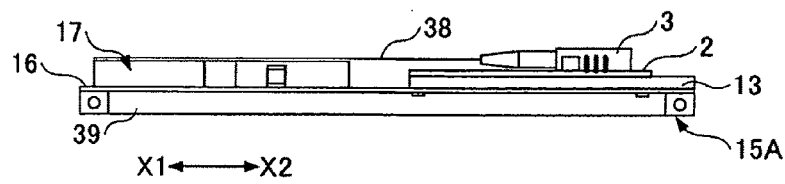

The optical amplifier 30A has the first board 2, the LDs 3, a radiator (heat dissipating) plate 13, the optical amplification element 17, and an erbium-doped optical fiber 38 (hereinafter, simply referred to as "optical fiber 38") (for example, FIG. 7B). FIGS. 7A and 7B and FIGS. 8A, 8B, 8C, and 8D show the optical amplifier 30A from which the lower case 15B is removed.

Figure 9:
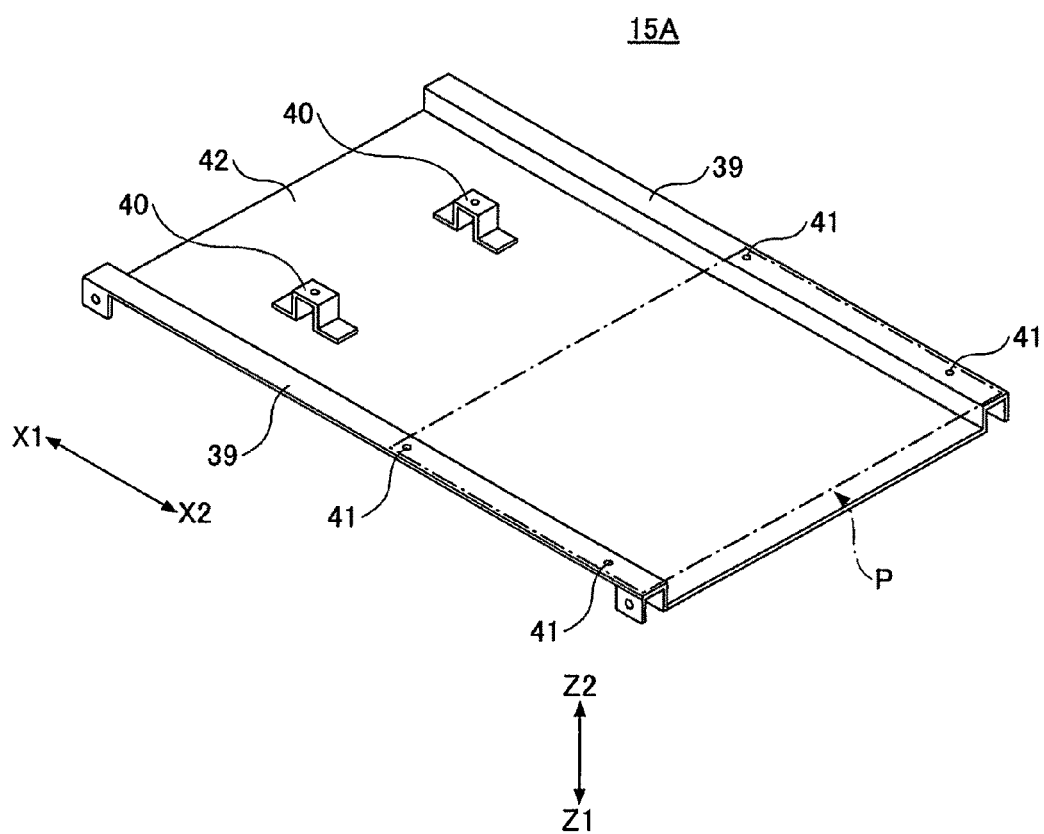
FIG. 9 is a perspective view of the bottom surface of an upper case of the optical amplifier according to the embodiment of the present invention.
Figure 10A:
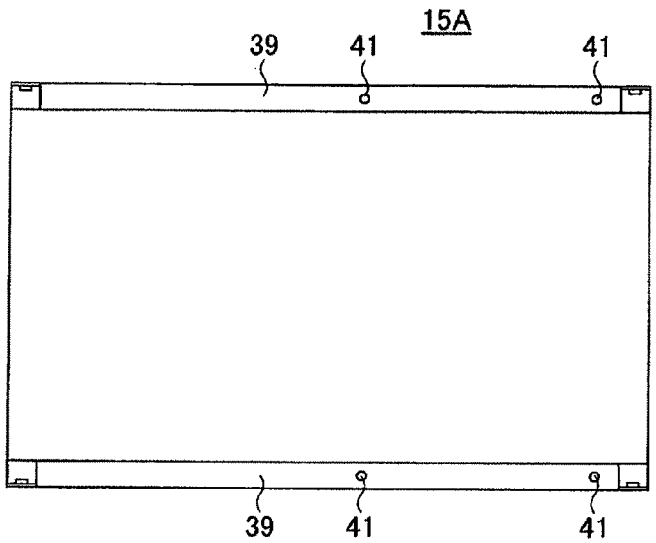
FIGS. 10A, 10B, and 10C are diagrams showing the upper case of the optical amplifier according to the embodiment of the present invention, where
Figure 10B:
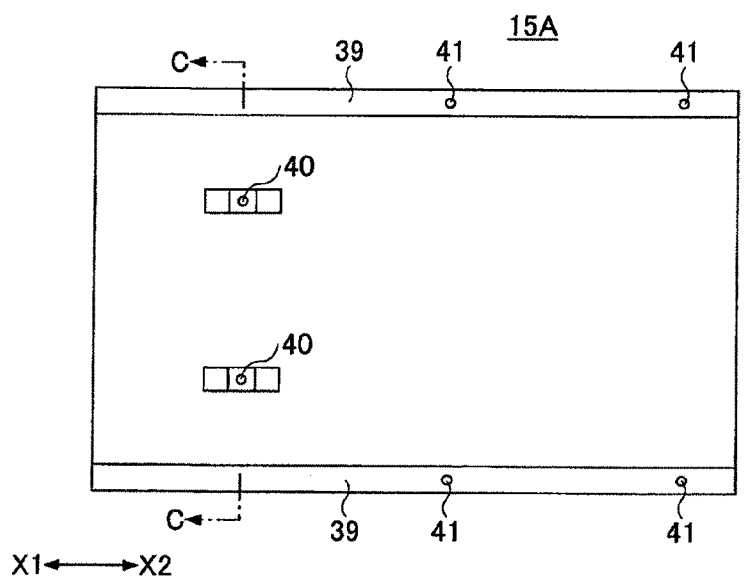
Figure 10C:
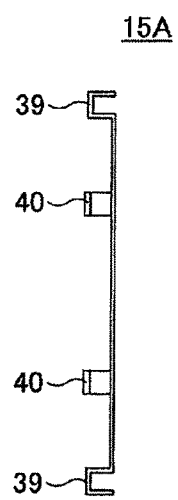

FIG. 9 is a perspective view of the upper case 15A, showing its rear (bottom or interior) surface. FIGS. 10A and 10B are a top plan view and a bottom plan view, respectively, of the upper case 15A. FIG. 10C is a cross-sectional view of the upper case 15A taken along the line C-C of FIG. 10B.

As shown enlarged in FIG. 9 and FIGS. 10A through 10C, the upper case 15 has a step part 39 formed on each longitudinal side thereof so as to extend along its length (in the X1-X2 directions) and rise from its rear surface (in the Z2 direction). As described below, the radiator plate 13 having the first board 2 mounted thereon is fixed at a position defined by a single-dot chain line indicated by arrow P in FIG. 9.

That is, the radiator plate 13 is fixed onto the step parts 39 so that a gap corresponding to the step (difference in level in the Z1-Z2 directions) is formed between a top plate part 42 of the upper case 15A and the radiator plate 13 with the radiator plate 13 being fixed to the step parts 39.

Further, a pair of attachment parts 40 are formed at corresponding positions on the X1 side of the position where the radiator plate 13 is provided on the upper case 15A. These attachment parts 40 are used to fix the optical amplification element 17 onto the upper case 15A. Screws (not graphically illustrated) are driven into corresponding threaded holes 41 formed in the step parts 39 at the time of fixing the radiator plate 13 to the step parts 39 of the upper case 15A.

Next, a description is given of the first board 2 and the radiator plate 13. The first board 2 is a printed wiring board. The LDs 3, an LD drive unit for driving the LDs 3, and a heater temperature sensor and an LD temperature controller for controlling the temperatures of the LDs 3 are mounted on the first board 2. The graphical illustration of the LD drive unit, the heater temperature sensor, and the LD temperature controller is omitted.

Referring to, for example, FIG. 7B, the first board 2 is mounted on the upper surface (the Z2-side surface) of the radiator plate 13. The radiator plate 13 is formed of a metal of good thermal conductivity, such as aluminum, an aluminum alloy, or a copper alloy. The upper surface of the radiator plate 13 is flat and smooth so that the first board 2 is mounted thereon. The first board 2 is fixed onto the upper surface of the radiator plate 13 with an insulating adhesive agent with high thermal conductivity.

Slits are formed in the first board 2 at positions corresponding to the positions where the LDs 3 are provided, so that the LDs 3 are adhered and fixed directly to the radiator plate 13. As a result, the heat generated in the LDs 3 can be dissipated (transmitted) directly to the radiator plate 13 without intervention of the first board 2, so that it is possible to improve the efficiency of heat dissipation.

Figure 11A:
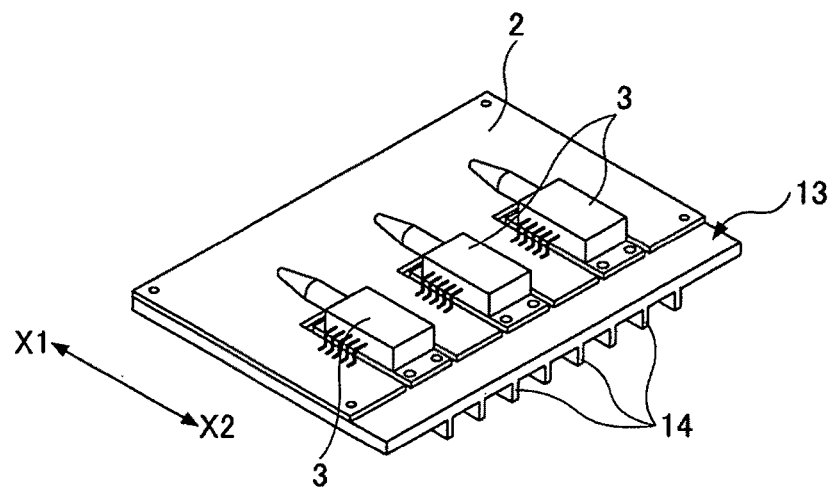
FIGS. 11A and 11B are diagrams showing a first board and a radiator plate of the optical amplifier according to the embodiment of the present invention, where
Figure 11B:
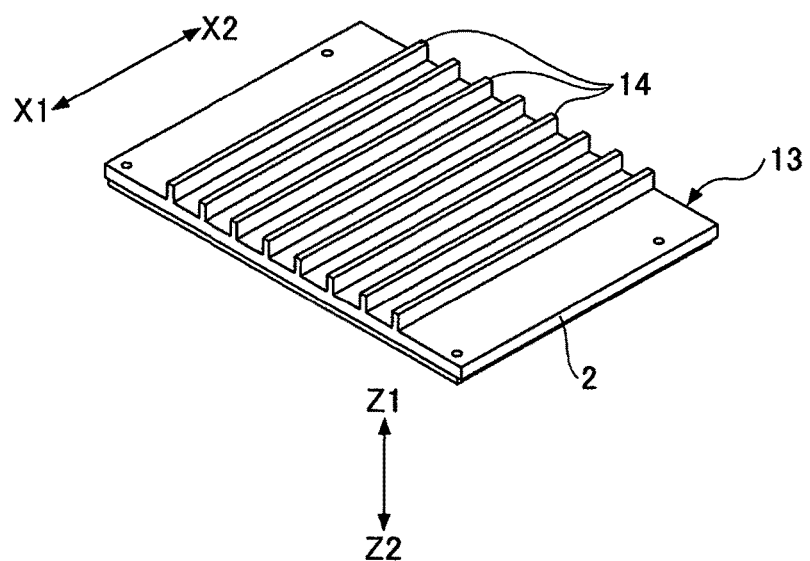

FIG. 11A is a top-side perspective view of the radiator plate 13 on which the first board 2 and the LDs 3 are provided. FIG. 11B is a perspective view of the radiator plate 13 of FIG. 11A turned upside down. FIGS. 12A, 12B, 12C, and 12D are a top plan view, a side view, a bottom plan view, and a rear view, respectively, of the radiator plate 13 on which the first board 2 and the LDs 3 are provided.

Referring to, for example, FIG. 11B or FIG. 12C, the multiple radiating fins 14 are integrated with the lower surface (the Z1-side surface) of the radiator plate 13. These radiating fins 14 are formed to extend in the X1-X2 directions and to project in the Z1 direction to be level with or slightly lower (shorter) than the above-described step parts 39 formed on the upper case 15A.

Accordingly, by fixing the radiator plate 13 having the first board 2 provided thereon to the upper case 15A (the step parts 39), the radiating fins 14 are housed inside the gap defined by the step parts 39. Further, in this state, the X2-end part of the space defined by the upper case 15A and the radiator plate 13 serves as the air intake 35 into which a current of cooling air created by the corresponding air blower 34 flows.

The optical amplification element 17 is fixed to the second board 16. The second board 16 is separate from the first board 2. Further, the second board 16 is screwed to the attachment parts 40 formed on the upper case 15A. Thereby, the optical amplification element 17 is fixed to the upper case 15A.

Since the second board 16 is provided separately from the first board 2 to make it possible to determine the vertical position (in the Z1-Z2 directions) of the second board 16 irrespective of the first board 2, and the attachment parts 40 are projecting from the top plate part 42 of the upper case 15A, it is possible to support the optical amplification element 17 above the top plate part 42.

On the other hand, the optical amplification element 17 provided on the second board 16 has the optical fiber 38 wound around the EDF reel 19. As described above, since the optical fiber 38 is temperature-dependent, it is desirable to increase the use environment temperature to, for example, 65° C. Therefore, the heater 18 (FIG. 3; not shown in the diagrams for illustrating the optical amplifier 30A) is provided inside the optical amplification element 17. Further, as described above, the heat insulator 24 (FIG. 1) is not provided for the optical amplification element 17, so that heat can be transferred between the optical amplification element 17 and the air (temperature environment) of the case 15. The optical fiber 38 led out from the optical amplification element 17 is connected to the LDs 3.

Referring back to FIG. 4, a description is given below, focusing on the flow of cooling air sent from the air blower 34. As described above, the cooling air sent from the air blower 34 flows into the case 15 through the air intake 35. The radiating fins 14 are provided in a predetermined range (where the radiator plate 13 is provided) in the X1-X2 directions from the air intake 35.

The heat generated in the LDs 3 is conducted to these radiating fins 14, so that a heat exchange occurs between the radiating fins 14 and the cooling air. As a result, the radiating fins 14 (radiator plate 13) are cooled while the temperature of the cooling air rises. By cooling the radiating fins 14, it is possible to dissipate heat from the LDs 3 with efficiency, so that it is possible to properly drive the LDs 3.

On the other hand, the optical amplification element 17 is provided on the downstream side in the flowing direction of the cooling air (X1 direction) in the case 15. Accordingly, the cooling air, whose temperature has risen at the radiating fins 14, flows into the position where the optical amplification element 17 is provided.

As described above, since the optical amplification element 17 is fixed above the top plate part 42 of the upper case 15A, the flowing cooling air is divided into two currents: one on the upper side (Z1 side) of the optical amplification element 17 and the other on the lower side (Z2 side) of the optical amplification element 17. That is, the cooling air whose temperature has risen forms currents (flow paths) flowing (running) over the entire upper and lower surfaces of the optical amplification element 17. The heat dissipation channel 37 inside the case 15 is indicated by arrows in FIG. 4.

As a result, a heat exchange occurs between the cooling air and the optical amplification element 17 where the optical amplification element 17 is provided. Consequently, the temperature of the optical amplification element 17 increases while the temperature of the cooling air decreases. This cooling air is discharged outside the case 15 through the air outlet 36.

Thus, according to this embodiment, the optical amplification element 17 is provided on the downstream side of the radiating fins 14, which dissipate the heat of the LDs 3, in the flowing direction of the cooling air in the heat dissipation channel 37 from the air intake 35 to the air outlet 36 of the cooling air formed inside the case 15. Therefore, it is possible to heat the optical amplification element 17 with the heat generated in the LDs 3.

Therefore, in the case of increasing the temperature of the optical amplification element 17 to a predetermined use environment temperature, it is possible to reduce the amount of heat supplied from the heater 18 to the optical amplification element 17 compared with the conventional configuration of increasing the temperature only with the heater 18. As a result, it is possible to reduce the electrical power used by the heater 18, so that it is possible to reduce the running cost of the optical amplifier 30A.

In this embodiment, the air outlet 36 is formed of small holes with a small opening size. Therefore, the air outlet 36 serves as a resistance to the cooling air discharged outside from the case 15. As a result, it is possible to cause the heated cooling air to stay near the optical amplification element 17, so that it is possible to raise the temperature of the optical amplification element 17 with efficiency.

Figure 13:
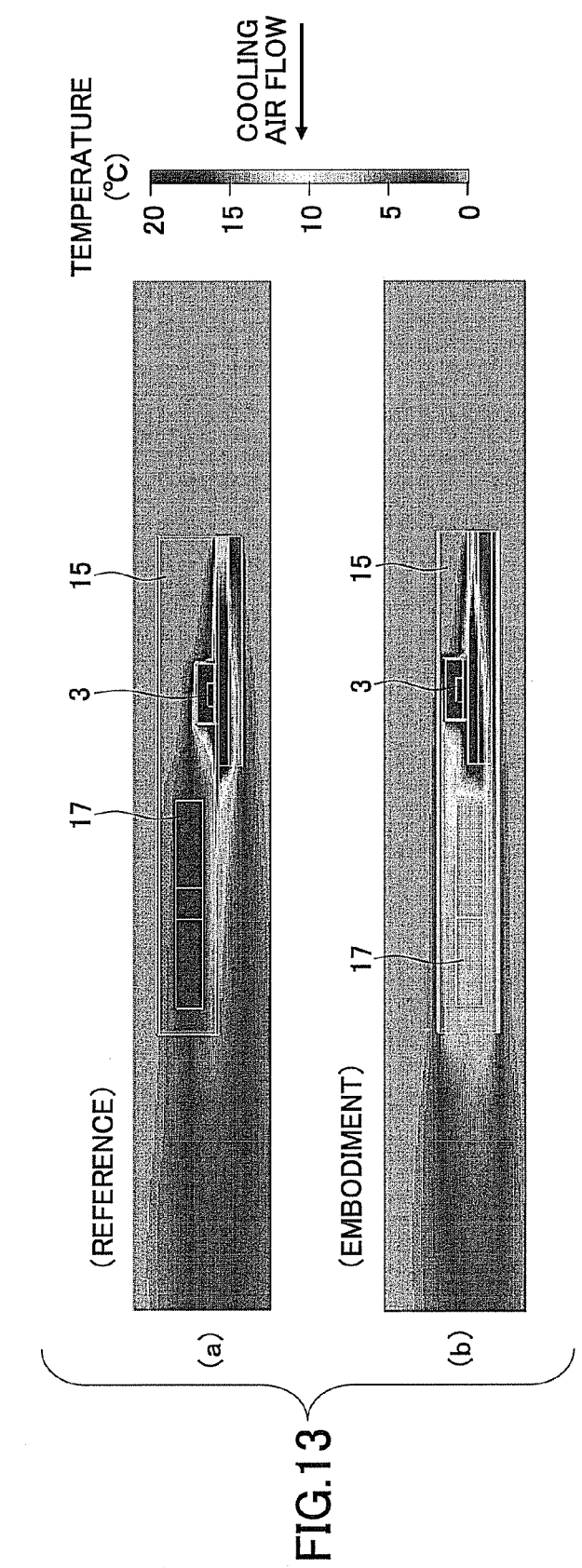
FIG. 13 is a diagram for illustrating an effect of the optical amplifier according to the embodiment of the present invention.

Referring to FIG. 13, (b) shows the results of simulating a heat distribution inside the case 15 in the case of forcibly cooling the optical amplifier 30A with the corresponding air blower 34, and (a) shows the results of performing the same simulation with respect to the conventional optical amplifier 1 shown in FIG. 1 for reference.

In the simulations of FIG. 13, regarding the optical amplification element 17, a lighter shade of gray scale indicates a higher temperature. Referring to FIG. 13, in the conventional optical amplifier 1 shown in (a), the position where the optical amplification element 17 is provided is indicated with dark gray, which shows that the temperature of the optical amplification element 17 is low.

On the other hand, in the optical amplifier 30A of this embodiment shown in (b) of FIG. 13, the position where the optical amplification element 17 is provided is indicated with light gray continuing from the position where the LDs 3 are provided, which shows that the temperature of the optical amplification element 17 has risen. The results of the simulations by the inventors of the present invention show that the temperature of the optical amplification element 17 is higher by approximately 8° C. in this embodiment than in the reference case shown in (b) of FIG. 13.

Figure 14:
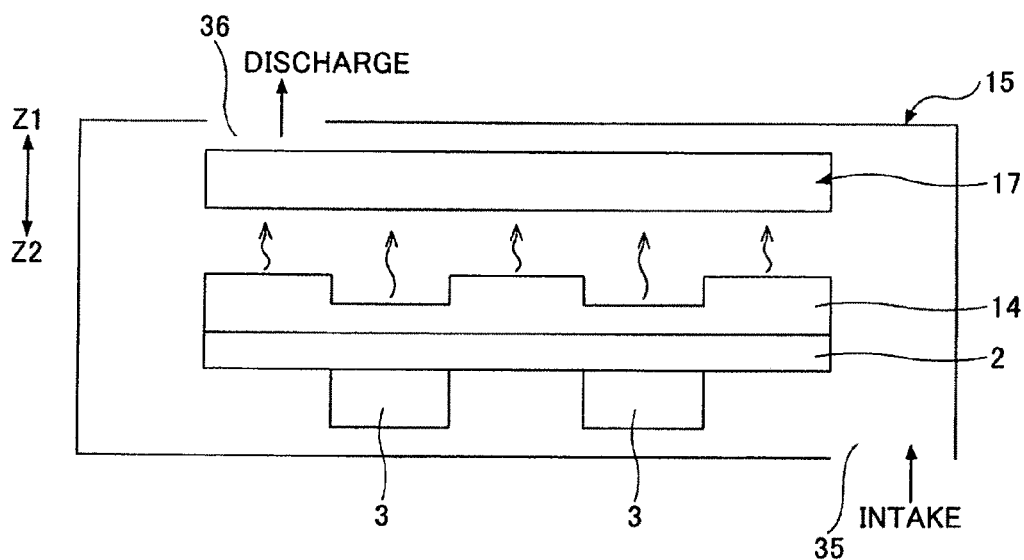
FIG. 14 is a diagram showing a first variation of the optical amplifier according to the embodiment of the present invention.

FIG. 14 is a schematic diagram showing an optical amplifier 30B, which is a first variation of the above-described optical amplifier 30A.

According to the optical amplifier 30A, cooling air is forced to flow into the case 15 by the air blower 34, so that the heat of the LDs 3 is conducted to the optical amplification element 17 with this forcibly-fed cooling air serving as a medium of thermal conduction.

On the other hand, the optical amplifier 30B is configured to heat the optical amplification element 17 through the natural convection of heat generated from the radiating fins 14. Therefore, in this variation, the optical amplification element 17 is placed in the direction of the natural convection of heat generated from the radiating fins 14, that is, at a position above (in the Z1 direction from) the position where the radiating fins 14 are provided inside the case 15. With this arrangement, the air intake 35 is provided at the bottom (on the Z2 side) of the case 15 and the air outlet 36 is provided at the top (on the Z1 side) of the case 15.

Thus, the air blowers 34 may be omitted, and the optical amplification element 17 can also be heated using the natural convection of heat inside the case 15.

Figure 15A:
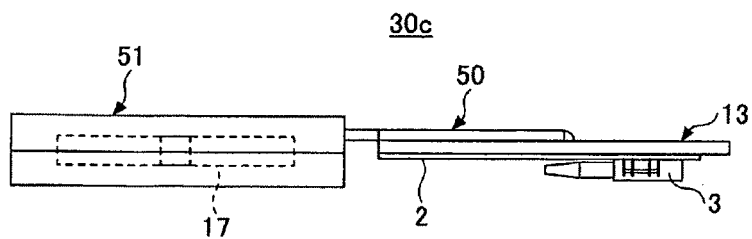
FIGS. 15A, 15B, and 15C are diagrams showing a second variation of the optical amplifier according to the embodiment of the present invention, where
Figure 15B:
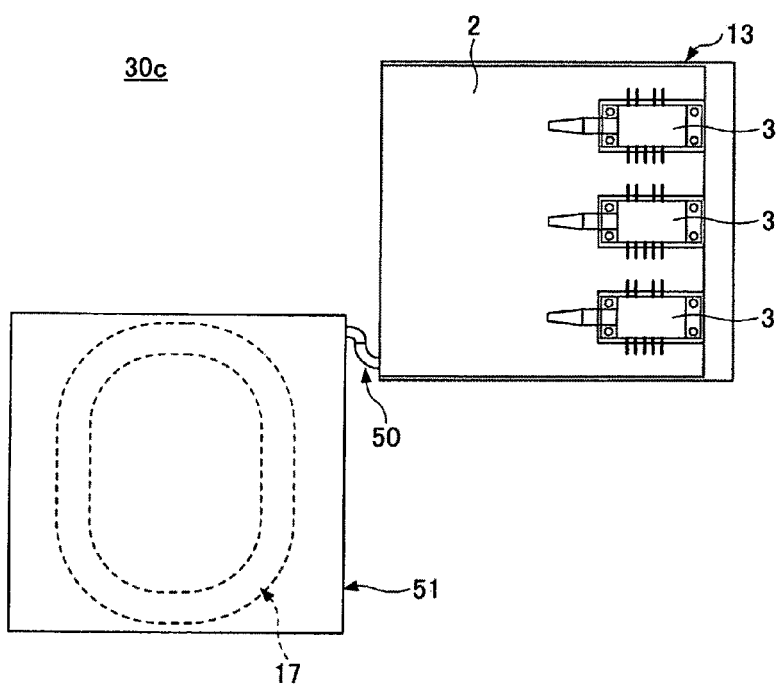
Figure 15C:
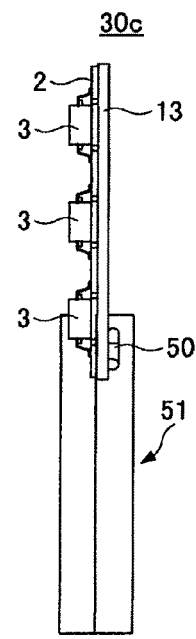

FIGS. 15A through 15C are a side view, a top plan view, and a rear view, respectively, of an optical amplifier 30C, which is a second variation of the above-described optical amplifier 30A.

The optical amplifier 30A is configured to conduct the heat of the LDs 3 to the optical amplification element 17 using cooling air as a medium of thermal conduction. On the other hand, the optical amplifier 30C employs a heat pipe 50 to conduct heat from the LDs 3 to the optical amplification element 17.

The heat pipe 50 is configured to have its cooling side (heat-absorbing side) thermally coupled to the radiator plate 13 and to have its heat dissipating side connected to a storage case 51 containing the optical amplification element 17. The heat pipe 50 is filled with a working fluid, so that the LDs 3 are cooled and the optical amplification element 17 is heated with the evaporation and condensation of this working fluid.

Further, the storage case 51 is made of not a material having heat insulating properties but a material having good thermal conductivity, such as aluminum. This makes it possible to also heat the optical amplification element 17 with the air heated by the LDs 3 inside the case 15 through the storage case 51, so that it is possible to further reduce power consumption by the heater 18 that heats the optical amplification element 17.

The present invention is not limited to the specifically disclosed embodiments, and variations and modifications may be made without departing from the scope of the present invention.

The present application is based on Japanese Priority Patent Application No. 2008-080735, filed on Mar. 26, 2008, the entire contents of which are hereby incorporated herein by reference.

What is claimed is:

1. An electronic device, comprising:
   a first component generating heat;
   a second component to be heated;
   a heating part configured to heat the second component; and
   a case containing the first component, the second component, and the heating part,
   wherein the second component is heated with the heating part and the heat generated by the first component.

2. The electronic device as claimed in claim 1, wherein the second component is an optical fiber doped with a rare-earth element.

3. The electronic device as claimed in claim 1, further comprising:
   a first board having the first component provided thereon; and
   a second board having the second component provided thereon,
   wherein the first board and the second board are provided separately in the case.

4. The electronic device as claimed in claim 3, wherein the first board includes a radiating fin extending into a channel through which the heat generated by the first component is dissipated.

5. The electronic device as claimed in claim 1, further comprising:
   an air blower part configured to feed cooling air to the first component, wherein the second component is placed on a downstream side of the first component in a direction of a current of the cooling air.

6. The electronic device as claimed in claim 5, further comprising:
a resistance part configured to serve as a resistance to the cooling air discharged through an air outlet of the case, the resistance part being provided on the air outlet.

7. The electronic device as claimed in claim 1, wherein:
the first component is cooled naturally with air, and
the second component is placed in a convection channel of the air heated by the first component.

8. An electronic device, comprising:
a first component generating heat;
a second component to be heated;
a heating part configured to heat the second component; and
a case containing the first component, the second component, and the heating part,
wherein the second component is placed in a channel through which the heat generated by the first component is dissipated.

9. The electronic device as claimed in claim 8, wherein the second component is an optical fiber doped with a rare-earth element.

10. The electronic device as claimed in claim 8, further comprising:
a first board having the first component provided thereon; and
a second board having the second component provided thereon,
wherein the first board and the second board are provided separately in the case.

11. The electronic device as claimed in claim 10, wherein the first board includes a radiating fin extending into the channel through which the heat generated by the first component is dissipated.

12. The electronic device as claimed in claim 8, further comprising:
an air blower part configured to feed cooling air to the first component,
wherein the second component is placed on a downstream side of the first component in a direction of a current of the cooling air.

13. The electronic device as claimed in claim 12, further comprising:
a resistance part configured to serve as a resistance to the cooling air discharged through an air outlet of the case, the resistance part being provided on the air outlet.

14. The electronic device as claimed in claim 8, wherein:
the first component is cooled naturally with air, and
the second component is placed in a convection channel of the air heated by the first component.

15. An electronic device, comprising:
a first component generating heat;
a second component to be heated;
a heating part configured to heat the second component;
a heat pipe having a cooling side thereof thermally coupled to the first component and having a heat dissipating side thereof thermally coupled to the second component; and
a case containing the first component, the second component, the heating part, and the heat pipe.

* * * * *